United States Patent [19]

Longmuir et al.

[11] 4,292,586

[45] Sep. 29, 1981

[54] TESTING OF CIRCUIT ARRANGEMENTS

[75] Inventors: Donald A. Longmuir, Loanhead; John M. Morrison, Edinburgh, both of Scotland

[73] Assignee: Ferranti Limited, Cheadle, England

[21] Appl. No.: 44,311

[22] Filed: May 31, 1979

[30] Foreign Application Priority Data

May 31, 1978 [GB] United Kingdom ............... 25470/78

[51] Int. Cl.³ ........................................... G01R 15/12
[52] U.S. Cl. .............................. 324/73 R; 324/73 PC; 324/51
[58] Field of Search .................. 324/73 AT, 73 R, 51, 324/73 PC

[56] References Cited

U.S. PATENT DOCUMENTS

| 3,777,129 | 12/1973 | Mehia | 324/73 PC |
|---|---|---|---|
| 4,058,767 | 11/1977 | Muehldorf | 324/73 AT |
| 4,108,358 | 8/1978 | Niemaszyk | 324/73 AT |
| 4,114,093 | 9/1978 | Long | 324/73 AT |
| 4,139,818 | 2/1979 | Schneider | 324/73 AT |

Primary Examiner—Michael J. Yokar

[57] ABSTRACT

Testing of thin film modules is facilitated by employing predetermined test procedures, so that analysis of the results is facilitated; and the test signals are supplied to, and the corresponding output signals are supplied from, the module terminals, a predetermined interface printed circuit board being connected to these terminals for this purpose, and so that electrical and mechanical damage to the module is obviated during the test procedures.

14 Claims, 1 Drawing Figure

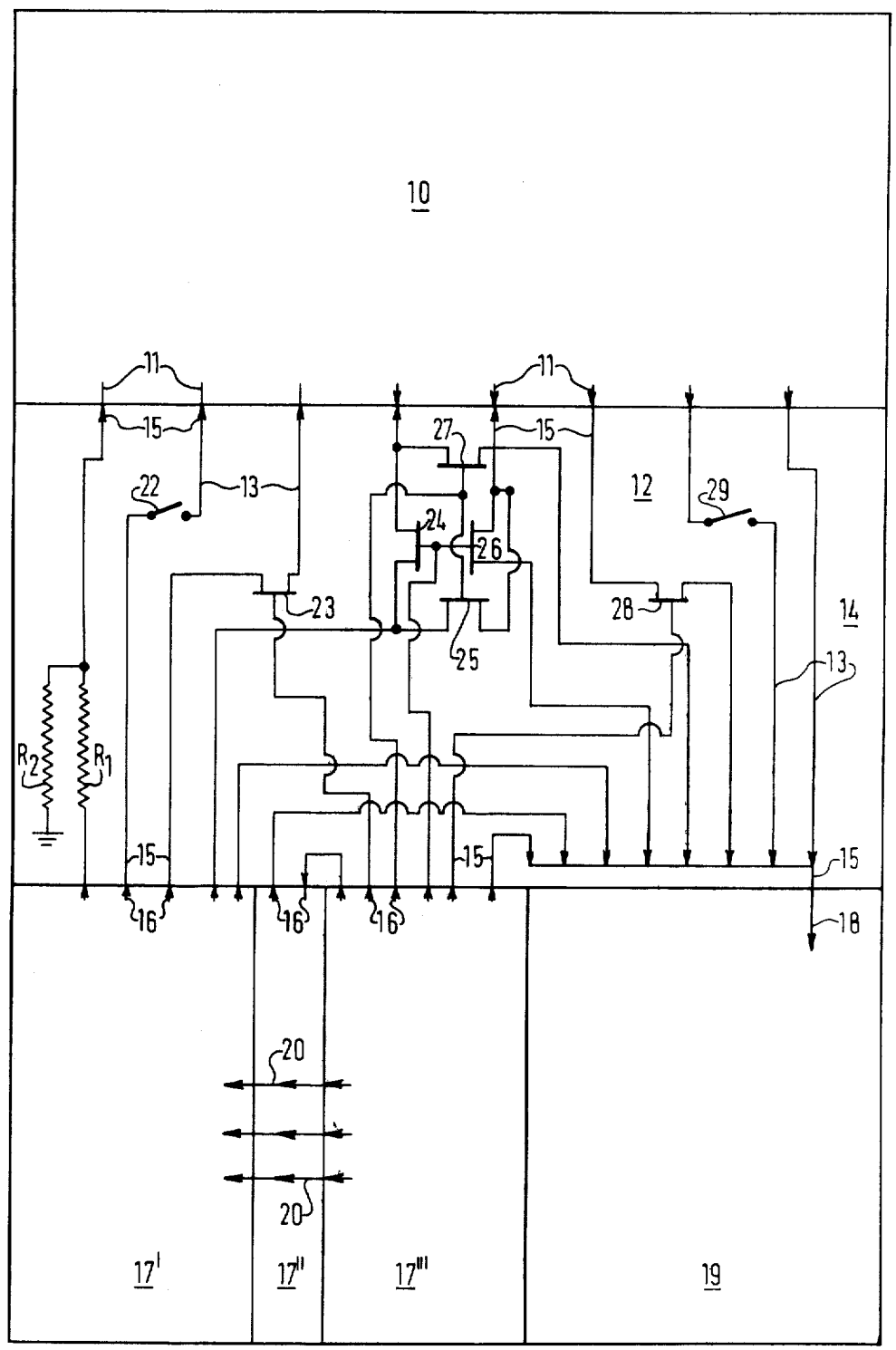

TESTING OF CIRCUIT ARRANGEMENTS

This invention relates to the testing of circuit arrangements.

It is an object of the present invention to provide means to facilitate the testing of a plurality of identical circuit arrangements and/or of a plurality of different forms of circuit arrangements, possibly at intermediate stages in the manufacture of the circuit arrangements, by common associated test equipment, and the testing being in a manner whereby mechanical and electrical damage of the circuit arrangements is obviated.

According to the present invention there is provided a combination of a circuit arrangement having a plurality of terminals, and interface means including a conductor pattern, some ends of the conductors being connected to connector parts co-operating with the terminals of the circuit arrangement to complete readily detachable electrical connections between the circuit arrangement and the interface means, and other ends of the conductors of the interface means being connected to connector parts to co-operate with output terminals of associated test equipment to complete electrical connections between the interface means and the test equipment, the test equipment to provide a plurality of different possible test signals from the different output terminals thereof, the arrangement of the combination being such that at least one such test signal is to be supplied in a test sequence to the circuit arrangement via the interface means, possibly, different test signals from the test equipment being capable of being supplied selectively to different constituent parts of the circuit arrangement via the interface means, and, in response to the test signals, output signals are to be obtained from the circuit arrangement to be indicative of the manners of operation of the parts of the circuit arrangement to receive the corresponding test signals from the test equipment, the output signals from the circuit arrangement to be supplied to indicating and/or measuring means associated with the combination and the test equipment.

The construction and form of the interface means is complementary to the constructions and forms both of the circuit arrangement and of the associated test equipment, the interface means usually being designed to co-operate between only the constructions and forms of the circuit arrangement provided and the provided associated test equipment.

At least one conductor of the interface means connected to the circuit arrangement also may be connected to a connector part to co-operate individually with an input terminal of the associated indicating and/or measuring means, to complete an electrical connection between the interface means and the indicating and/or measuring means. With such an arrangement the output signals to be obtained from the circuit arrangement, in response to the test signals, at least partially are to be supplied from the terminals of the circuit arrangement to the interface means. In any event, it is desirable that the output signals from the circuit arrangement are provided at the terminals of the circuit arrangement.

The provision of the interface means facilitates the testing of a plurality of identical circuit arrangements because it enables the test signals from the associated test equipment to be supplied to the terminals of the circuit arrangement, and possibly also facilitates the output signals from the circuit arrangement, obtained in response to the test signals, to be supplied from the terminals of the circuit arrangement. Further, the provision of the readily detachable electrical connections between each circuit arrangement and the interface means facilitates the connecting of the circuit arrangement to the associated test equipment, and possibly also to the associated indicating and/or measuring means, in the appropriate manner. Thus, the throughput rate for testing the identical circuit arrangements is higher than otherwise would be the case.

In addition, by being able to employ the terminals of a circuit arrangement for test purposes, the possibility of causing mechanical damage to the circuit arrangement whilst testing it is greatly reduced.

The readily detachable electrical connections between each circuit arrangement and the interface means may have any convenient, known, form.

Testing by employing the combination according to the present invention has the further advantage that electrical damage to the circuit arrangement is avoided, such damage being caused by incorrect test signals being applied to the circuit arrangement, and/or by test signals being applied unintentionally to inappropriate parts of the circuit arrangement by an operator employing test probes.

Further, the provision of the interface means enables the testing to be performed to be versatile.

Thus, the selective testing of the different constituent parts of the circuit arrangement by common associated test equipment is facilitated. It may not be essential that the different constituent parts of the circuit arrangement to be tested selectively are electrically isolated from each other during the different testing steps, and, possibly, interaction between the different constituent parts also may be tested. It is possible that at least two different constituent parts of the circuit arrangement to be tested selectively have a common portion.

The construction of the circuit arrangement also may be such that the circuit arrangement can be tested in the manner referred to above at intermediate stages in the manufacture of the circuit arrangement, which is not practicable when electrical or mechanical damage is likely in the test procedure. Possibly the same, or different, interface means are employed when the circuit arrangement is tested at the different stages in its manufacture, including testing the completed circuit arrangement. Thus, scrapping of a faulty circuit arrangement may be possible at intermediate manufacturing stages, and/or remedial measures may be taken for faults detected at intermediate manufacturing stages, in addition to when manufacturing is completed.

In addition, testing of a plurality of different forms of circuit arrangement by common associated test equipment may be possible, possibly appropriate different forms of interface means being provided for the different forms of circuit arrangement to be tested.

It is possible that at least one signal, supplied by the associated test equipment, to the associated indicating and/or measuring means, is not provided via the circuit arrangement, and possibly at least one conductor of the interface means is required to connect the test equipment and the indicating and/or measuring means for this purpose. Such a signal could be provided to the indicating and/or measuring means for the purpose of direct comparison of this signal with an output signal or signals obtained from the circuit arrangement, possibly in response to the same signal being supplied also as a test signal to the circuit arrangement.

It is not essential that each of the plurality of different possible test signals from the associated test equipment are supplied to a circuit arrangement under test, for example, at different stages in its manufacture; and/or to different forms of circuit arrangement to be tested.

A combination of test signals may be supplied simultaneously to the circuit arrangement, instead of a single test signal.

Whilst the test sequence may comprise only one signal, or one simultaneous combination of signals, it is usual for a predetermined series of a plurality of test signals to be supplied to the circuit arrangement in a test sequence, usually different constituent portions of suach a test sequence to be provided from different output terminals of the test equipment. Switching means may be included in the interface means, so that the same output terminal of the test equipment can be connected to the circuit arrangement and/or to the indicating and/or measuring means selectively at different times in a test sequence, possibly the output terminal of the test equipment being connected selectively to different constituent parts of the circuit arrangement. The switching means included in the interface means may be actuable in any convenient manner, and may be at least partially manually operable.

The circuit arrangement may have any convenient form, for example, comprising a thin film module.

The interface means may have any convenient form, and may at least include the pattern of conductors, together with the appropriate associated connector parts, mounted upon a substrate of electrical insulating material.

The interface means also may include at least one electrical component in order to modify in a required manner at least one of the test signals before its supply to the circuit arrangement; and/or, when the interface means is to be connected to the associated indicating and/or measuring means, to modify in a required manner at least one of the signals to be supplied to the indicating and/or measuring means. Hence, for these reasons, or otherwise, the interface means could include variable gain amplifiers, potentiometers, resistors, capacitors, and asymmetric conduction devices.

According to another aspect the present invention comprises a combination of circuit arrangement and interface means, of any one of the different possible forms referred to above, test equipment to provide a plurality of different possible test signals from different output terminals thereof, at least one such test signal to be supplied to the circuit arrangement via the interface means, possibly, different test signals from the test equipment being capable of being supplied in a test sequence selectively to different constituent parts of the circuit arrangement via the interface means, and the apparatus also includes indicating and/or measuring means to receive output signals from the circuit arrangement in response to test signals from the test equipment, the output signals from the circuit arrangement to be indicative of the manners of operations of the parts of the circuit arrangement to receive the corresponding test signals from the test equipment.

The electrical connections between the interface means and the test equipment, and possibly also the electrical connections between the interface means and the indicating and/or measuring means, if such latter electrical connections are provided, may have any convenient, known, form, may be readily detachable, and may be at least similar to the electrical connections between the interface means and the circuit arrangement.

The different constituent portions of a test sequence supplied to the circuit arrangement may be provided, at least partially, under manual control, and/or the test equipment includes a test signal producing part and a part comprising sequencing means, in response to output signals from the sequencing means at least part of a predetermined sequence of test signals are to be provided automatically from the test equipment. At least one conductor of the interface means may connect the test signal producing part and the sequencing means.

As referred to above, it is possible that the same output signal from the test equipment is to be supplied to the circuit arrangement and/or to the indicating and/or measuring means selectively at different times in a test squence, and for this purpose switching means is provided. The switching means at least partially may not be provided in the interface means. In any arrangement the switching means may be actuated automatically by sequencing means included, anywhere, in the apparatus. At least one conductor of the interface means may connect the sequencing means and at least the part of the switching means not included in the interface means. Alternatively, or in addition, the switching means may be at least partially manually operable.

The apparatus may be such that at least one of the test signals to be supplied by the test equipment to a constituent part of the circuit arrangement is supplied by a constituent part of the test equipment to operate substantially in the inverse of the normally expected manner of operation of the corresponding constituent arrangement, and said at least one test signal is to be supplied to the indicating and/or measuring means, enabling a comparison to be made of said at least one test signal with the corresponding output signal from the constituent part of the circuit arrangement.

According to yet another aspect the present invention comprises a method of testing a circuit arrangement having a plurality of terminals by employing apparatus of any one of the possible forms referred to above, the method including providing interface means connected to the circuit arrangement and to be connected to the test equipment, the arrangement of the combination of the circuit arrangement and the interface means being such that, in the method, at least one test signal is supplied to the circuit arrangement via the interface means, possibly, different test signals from the test equipment are capable of being supplied in a test sequence selectively to different constituent parts of the circuit arrangement via the interface means, and, in response to the test signals, output signals are obtained from the circuit arrangement, each such output signal from the circuit arrangement being indicative of the manner of operation of the associated part of the circuit arrangement receiving the corresponding test signal from the test equipment, and the output signals from the circuit arrangement, provided in response to the test signals from the test equipment, are supplied to the indicating and/or measuring means.

The present invention will now be described by way of example with reference to the accompanying drawing, which comprises a circuit diagram of interface means, of a combination of a circuit arrangement to be tested and the interface means in accordance with one embodiment of the present invention; the circuit arrangement, together with both associated test equipment to supply test signals, via the interface means, to the constituent part of the circuit arrangement, and associated indicating and/or measuring means to receive corresponding output signals from the circuit arrangement, in response to the test signals, and indicative of the manners of operation of the constituent parts of the circuit arrangement, all being shown in block form in relation to the circuit of the interface means.

A circuit arrangement 10 to be tested, in the form of a thin film module, and shown in block form, but with eight terminals 11 distributed along one edge thereof, is shown as cooperating with interface means, indicated at 12, the combination of the circuit arrangement 10 and the interface means 12 comprising one embodiment according to the present invention.

The interface means 12 includes a pattern of conductors 13 on a substrate 14 of electrical insulating material. At the end of each conductor 13, at the periphery of the interface means is provided a connector part 15. Along one edge of the interface means are provided eight connector parts 15 to cooperate with the terminals 11 of the circuit arrangement 10, to form readily detachable electrical connections between the circuit arrangement and the interface means. Distributed along the opposite edge of the interface means are a plurality of connector parts 15 to co-operate with output terminals 16 of associated test equipment 17, shown in block form, to form readily detachable electrical connections between the interface means and the test equipment 17; and there is also provided one connector part 15 to co-operate with a terminal 18 of associate indicating and/or measuring means 19, shown in block form, to form a readily detachable electrical connection between the interface means and the indicating and/or measuring means 19. Thus, the circuit arrangement is connected, via the interface means, with both the associated test equipment 17 and the associated indicating and/or measuring means 19.

The test equipment 17 is to provide a plurality of different possible test signals from the different output terminals 16 thereof, and the arrangement of the combination of the circuit arrangement and the interface means is such that at least one such test signal, or one simultaneous combination of test signals, is to be supplied in a test sequence to the circuit arrangement via the interface means, possibly, different test signals, or different simultaneous combinations of test signals, from the test equipment, being capable of being supplied selectively to different constituent parts of the circuit arrangement via the interface means. In response to the test signals, output signals are to be obtained from the circuit arrangement, to be indicative of the manners of operation of the parts of the circuit arrangement to receive the corresponding test signals from the test equipment. These output signals from the circuit arrangement are supplied to the indicating and/or measuring means via the interface means. Hence, the construction and form of the interface means is required to be complementary to the constructions and forms of the circuit arrangement, the test equipment, and the indicating and/or measuring means. Usually the interface means is designed to co-operate between only the constructions and forms of the circuit arrangement provided and the provided associated test equipment.

It is not essential that each of the plurality of different possible test signals from the associated test equipment are supplied to a circuit arrangement under test.

The provision of the interface means facilitates the testing of a plurality of identical circuit arrangements because it enables the test signals from the test equipment; and the output signals from the circuit arrangement, obtained in response to the test signals, and to be supplied to the indicatng and/or measuring means; to be supplied to the terminals of the circuit arrangement. The provision of the readily detachable electrical connections between each circuit arrangement and the interface means facilitates the connecting of the circuit arrangement to the test equipment, and to the indicating and/or measuring means, in the appropriate manner. Thus, the throughput rate for testing the identical circuit arrangements is higher than otherwise would be the case.

In addition, by being able to employ the terminals of a circuit arrangement for test purposes, the possibility of causing mechanical damage to the circuit arrangement whilst testing it is greatly reduced.

Further, electrical damage caused by incorrect test signals being applied to the circuit arrangement, and/or by test signals being applied unintentionally to inappropriate parts of the circuit arrangement by an operator using test probes, is avoided.

The circuit arrangement and the interface means may have any convenient form, and in particular the readily detachable electrical connections between the ciruit arrangement and the interface means may have any convenient, known, form, for example, comprising plugs and co-operating sockets. Similarly the test equipment and the indicating and/or measuring means may have any convenient, known, form, and in particular the electrical connections between these parts of the illustrated apparatus and the interface means may have any convenient, known, form, possibly being readily detachable, and possibly being at least similar to the electrical connections between the interface means and the circuit arrangement.

The construction of the circuit arrangement may be such that the testing is facilitated. Thus, it is possible that terminals are provided for the circuit arrangement only for test purposes, these terminals being redundant during normal operation of the circuit arrangement. Alternatively, or in addition, the circuit arrangement under test may be such that a required circuit function is obtained by connecting at least one electrical component, external of the circuit arrangement, to a terminal of the circuit arrangement; and/or by coupling together in the appropriate manner terminals of the circuit arrangement; subsequent to the testing of the circuit arrangement in the manner referred to above.

The test signals may be supplied to output terminals of the circuit arrangement when the circuit arrangement is operating in its normal manner; and/or the signals obtained in response to test signals may be supplied from input terminals of the circuit arrangement when the circuit arrangement is operating in its normal manner. In relation to some terminals of the circuit arrangement, test signals may be supplied thereto, and at different times in the testing operation, output signals in response to test signals may be obtained therefrom.

More than one terminal of the circuit arrangement may receive either a test signal, or simultaneous test signals; and/or more than one terminal of the circuit arrangement may be supplied with signals in response to each test signal, or combination of test signals, provided to the circuit arrangement.

Whilst the test sequence may comprise only one signal, or one simultaneous combination of signals, it is usual for a predetermined series of a plurality of test signals to be supplied to the circuit arrangement, in a test sequence, usually different constituent portions of such a test sequence to be provided from different output terminals of the test equipment.

The illustrated test equipment is shown as comprising three parts, a test signal producing part 17', switching means 17", and sequencing means 17'". Thus, a unique sequence of test signals may be provided for a circuit arrangement by presetting the sequencing means and/or the switching means. Direct electrical connections between the sequencing means, the switching means, and the test signal producing part, are indicated generally at 20 in the drawing for this purpose. In addition, the sequencing means 17'" is shown as being connected via a conductor of the interface means to the switching means 17'". In the illustrated embodiment two electrical connections are shown as being provided between the switching means 17" and the interface means, and six electrical connections are shown as being provided between the sequencing means 17'" and the interface means, but only one each of these electrical connections are connected together. The switching means 17" may be actuated automatically in response to signals from the sequencing means 17'" supplies via the eletrical connections therebetween. In addition, or alternatively, the switching means may be manually operable.

The illustrated interface means shows five terminals 16 of the test signal producing part 17' of the test equipment being connected by conductors 13 of the interface means to five terminals 11 of the circuit arrangement. A first such conductive path includes a resistor R1, in parallel with a resistor R2 connected to earth. A second conductive path includes a manually operable switch 22 so that the test signal supplied via the conductive path is only provided to the circuit arrangement when desired. The third conductive path includes an electronic switch 23, in the form of a field-effect transistor (FET), and is actuated automatically in response to signals from the sequencing means, and for this purpose one of the electrical interconnections between the interface means and the sequencing means is connected to the FET 23. The fourth and fifth conductive paths are cross coupled with two conductive paths between the circuit arrangement and the indicating and/or measuring means, the fourth conductive path including a FET 24, the fifth conductive path including a FET 25, and the two paths to the indicating and/or measuring means each including a FET 26 or 27. The FET's 24 and 26 are coupled to the same terminal of the sequencing means, and the FET's 25 and 27 are coupled to another terminal of the sequencing means. The arrangement is such that when a test signal is supplied to the fourth terminal of the circuit arrangement a corresponding output signal is supplied from the fifth terminal of the circuit arrangement to the indicating and/or measuring means, and vice versa, the changeover being automatic in response to output signals from the sequencing means.

The remaining three terminals 11 of the circuit arrangement are connected by conductors 13 of the interface means solely to the single terminal 18 of the indicating and/or measuring means. The first such conductive path includes a FET 28 actuated automatically in response to an output signal from the sequencing means. The second such conductive path includes a manually operable switch 29 so that a signal is supplied to the indicating and/or measuring means only when desired. The third such conductive path connects directly the associated terminal of the circuit arrangement with the indicating and/or measuring means.

In addition, the interface means includes a conductor connecting directly a terminal of the test signal producing part of the test equipment to the indicating and/or measuring means. Hence, a signal is provided to the indicating and/or measuring means to be compared with a signal or signals obtained from the circuit arrangement, possibly in response to the same signal being supplied also as a test signal to the circuit arrangement.

Further, a conductor of the interface means connects directly a terminal of the sequencing means to the indicating and/or measuring means.

The switching means 22 to 25 each enables the same output terminal of the test equipment to be connected selectively at different times in a test sequence to the circuit arrangement, the switching means 24 and 25 enabling the same output terminal of the test equipment to be connected selectively at different times in a test sequence to different constituent parts of the circuit arrangement.

The switching means 26 to 29 each enables the same terminal of the circuit arrangement to be connected selectively at different times in a test sequence to the indicating and/or measuring means, the switching means 26 and 27 enabling different terminals of the circuit arrangement to be connected selectively at different times in a test sequence to the indicating and/or measuring means.

The switching means 17" may be employed in the same manner as the switching means 22 to 29, as referred to above, and either in addition to, or alternatively to, the switching means 22 to 29.

It may be especially advantageous for the apparatus to be such that at least one of the test signals, to be supplied by the test equipment to a constituent part of the circuit arrangement, to be supplied by a constituent part of the test equipment to operate substantially in the inverse of the normally expected manner of operation of the corresponding constituent part of the circuit arrangement, and said at least one test signal also is to be supplied to the indicating and/or measuring means, enabling a comparison to be made of said at least one test signal with the corresponding output signal from the constituent part of the circuit arrangement.

Whereas the interface means is shown as including the resistors R1 and R2, it is also possible for the interface means to include variable gain amplifiers, and/or potentiometers, and/or cpacitors, and/or asymmetric conduction devices, instead of, or in addition to, the resistor. The electrcal components included in the interface means may be to modify in a required manner at least one of the test signals before its supply to the circuit arrangement; and/or to modify in a required manner at least one of the signals to be supplied to the indicating and/or measuring means.

Because of the use of the interface means it is possible to simply test procedures so that relatively unskilled operators can be employed, where otherwise highly skilled operators would have been required. Thus, for each constituent part of a test sequence to which a circuit arrangement is to be subjected it is possible to predict the form of each corresponding output signal from the circuit arrangement; and it is possible to predetermine the criteria determining either the acceptable range of magnitudes of the relevant parameter cf the output signal from the circuit arrangement e.g. the tolerance, or the relationship between the magnitude of this parameter of the output signal from the circuit arrangement to the magnitudes of parameters of other output signals from other constituent parts of the circuit arrangement. Hence, the operator does not need to interpret the test results, or the circuit arrangement can be designed so that any interpretation required by the operator is simple. All the required analysis of the circuit arrangement, and possibly all the required interpretation of test results likely to be obtained, can be done once, at the initial design stage for the circuit arrangement, and it is unimportant if such analysis and interpretation to be performed at the design stage is both complex and difficult. It is possible that, in this way, a more detailed interpretation of the test results obtained is possible than otherwise would be practicable. The test results can be compared directly with the test results obtained from a reference circuit arrangement, and/or the operation of the test equipment, and the indicating and/or measuring means, could be monitored by repeating the test procedures on the reference circuit arrangement at intervals, so that no absolute measurements may be required to be made.

The provision of the interface means enables the testing to be performed to be versatile.

Hence, the selective testing of the different constituent parts of the circuit arrangement by common associated test equipment is facilitated. It may not be essential that the different constituent parts of the circuit arrangement to be tested selectively are electrically isolated from each other during the different testing steps, and, possibly, interaction between the different constituent parts also may be tested. It is possible that at least two different constituent parts of the circuit arrangement to be tested selectively have a common portion.

The construction of the circuit arrangement also may be such that the circuit arrangement can be tested at intermediate stages in the manufacture of the circuit arrangement, which is not practicable when electrical or mechanical damage is likely in the test procedure. Possibly the same, or different, interface means are employed when the circuit arrangement is tested at the different stages in its manufacture, including testing the completed circuit arrangement. Thus, scrapping of a faulty circuit arrangement may be possible at intermediate manufacturing stages, and/or remedial measures may be taken for faults detected at intermediate manufacturing stages, in addition to when manufacturing is completed.

In addition, testing of a plurality of different forms of circuit arrangements by common associated test equipment may be possible, possibly appropriate different forms of interface means being provided for the different forms of circuit arrangement to be tested.

The apparatus may be modified in several different possible ways.

The indicating and/or measuring means may not be connected to the circuit arrangement, or may not be wholly so connected, via the interface means, but instead at least partially is directly connected thereto, in any convenient way. However, it is desirable that the indicating and/or measuring means is connected to terminals of the circuit arrangement.

When the indicating and/or measuring means is connected to the circuit arrangement via the interface means, there may be a plurality of electrical connections between the interface means and the indicating and/or measuring means.

The test equipment and/or the interface means may be simpler than as described above and illustrated. For example, the sequencing means, and/or the switching means, and/or the electrical components of the interface means, may be at least partially omitted.

A printer and/or an oscilloscope may be included in the indicating and/or measuring means.

The required sequencing means may be provided in the interface means.

The switching means, and/or the sequencing means, if provided, at least partially may not be provided within either the test equipment and/or the interface means.

What we claim is:

1. Apparatus comprising a circuit arrangement having a plurality of terminals, test equipment to provide a plurality of different test signals from output terminals thereof, at least one test signal to be supplied in a test sequence to the circuit arrangement, indicating means to receive output signals from the circuit arrangement in response to the test sequence from the test equipment, the output signals from the circuit arrangement being indicative of the manners of operation of the parts of the circuit arrangement to receive the test signals, and interface means connected between the test equipment and the circuit arrangement, the interface means including a pattern of conductors and connector parts mounted upon a substrate of electrical insulating material, the connector parts cooperating with the terminals of the circuit arrangement and the output terminals of the test equipment, to complete electrical connections between the circuit arrangement and the test equipment through the interface means, and the interface means including at least one electrical component arranged to modify in a required manner at least one of the test signals before it is supplied to the circuit arrangement.

2. Apparatus as claimed in claim 1 in which at least one conductor of the interface means is connected to a connector part to cooperate individually with an input terminal of the indicating means.

3. Apparatus as claimed in claim 2 in which at least one conductor of the interface means connects the circuit arrangement to the indicating means.

4. Apparatus as claimed in claim 2 or claim 3 in which at least one conductor of the interface means connects the test equipment to the indicating means.

5. Apparatus as claimed in claim 2, or claim 3 or claim 20 in which the interface means includes at least one electrical component arranged to modify in a required manner at least one of the signals to be supplied to the indicating means.

6. Apparatus as claimed in claim 1 in which the test equipment includes a test signal producing part and a part comprising sequencing means, in response to output signals from the sequencing means at least part of a predetermined sequence of test signals are to be provided automatically from the test equipment.

7. Apparatus as claimed in claim 6 in which at least one conductor of the interface means connects the test signals producing part and the sequencing means.

8. Apparatus comprising a circuit arrangement having a plurality of terminals, test equipment to provide a plurality of different test signals from output terminals thereof, at least one test signal to be supplied in a test sequence to the circuit arrangement, indicating means to receive output signals from the circuit arrangement in response to the test sequence from the test equipment, the output signals from the circuit arrangement being indicative of the manners of operation of the parts of the circuit arrangement to receive the test signals, and interface means connected between the test equipment and the circuit arrangment, the interface means including a pattern of conductors and connector parts mounted upon a substrate of electrical insulating material, the connector parts cooperating with the terminals of the circuit arrangement and the output terminals of the test equipment, to complete electrical connections between the circuit arrangement and the test equipment through the interface means, and the interface means including at least one electrical component arranged to modify in a required manner at least one of the test signals before it is supplied to the circuit arrangement in which switching means is included in the apparatus, so that the same output terminal of the test equipment can be connected to the circuit arrangement; and to the indicating means; selectively at different times in a test sequence.

9. Apparatus as claimed in claim 8 in which at least part of the switching means is included in the interface means.

10. Apparatus as claimed in claim 8 or claim 9 in which the arrangement is such that the switching means is at least partially actuated automatically by sequencing means included in the apparatus.

11. Apparatus as claimed in claim 10 in which at least one conductor of the interface means connects the sequencing means and at least part of the switching means not included in the interface means.

12. Apparatus comprising a circuit arrangement having a plurality of terminals, test equipment to provide a plurality of different test signals from output terminals thereof, at least one test signal to be supplied in a test sequence to the circuit arrangement, indicating means to receive output signals from the circuit arrangement in response to the test sequence from the test equipment, the output signals from the circuit arrangement being indicative of the manners of operation of the parts of the circuit arrangement to receive the test signals, and interface means connected between the test equipment and the circuit arrangement, the interface means including a pattern of conductors and connector parts mounted upon a substrate of electrical insulating material, the connector parts cooperating with the terminals of the circuit arrangement and the output terminals of the test equipment, to complete electrical connections between the circuit arrangement and the test equipment through the interface means, and the interface means including at least one electrical component arranged to modify in a required manner at least one of the test signals before it is supplied to the circuit arrangement in which at least one of the test signals to be supplied by the test equipment to a constituent part of the circuit arrangement is supplied by a constituent part of the test equipment to operate substantially in the inverse of the normally expected manner of operation of the corresponding constituent part of the circuit arrangement, and said at least one test signal also is supplied to the indicating means for comparison to be made of said at least one test signal with the corresponding output signal from the constituent part of the circuit arrangement.

13. Apparatus as claimed in claim 1 adapted for the testing of a plurality of different forms of circuit arrangement by employing common test equipment.

14. Apparatus as claimed in claim 13 in which appropriate different forms of interface means are provided for the different forms of circuit arrangement to be tested.

* * * * *